(12) United States Patent
Schultz et al.

(10) Patent No.: US 9,984,846 B2
(45) Date of Patent: May 29, 2018

(54) HIGH BRIGHTNESS BORON-CONTAINING ELECTRON BEAM EMITTERS FOR USE IN A VACUUM ENVIRONMENT

(71) Applicant: KLA-Tencor Corporation, Milpitas, CA (US)

(72) Inventors: William G. Schultz, San Jose, CA (US); Gildardo R. Delgado, Livermore, CA (US); Frances Hill, Sunnyvale, CA (US); Edgardo Garcia Berrios, San Jose, CA (US); Rudy Garcia, Union City, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days. days.

(21) Appl. No.: 15/217,158

(22) Filed: Jul. 22, 2016

(65) Prior Publication Data
US 2018/0005791 A1    Jan. 4, 2018

Related U.S. Application Data

(60) Provisional application No. 62/356,738, filed on Jun. 30, 2016.

(51) Int. Cl.
| | |
|---|---|
| *H01J 1/34* | (2006.01) |
| *H01J 1/304* | (2006.01) |
| *H01J 9/02* | (2006.01) |
| *H01J 19/24* | (2006.01) |

(52) U.S. Cl.
CPC .............. *H01J 1/3044* (2013.01); *H01J 1/34* (2013.01); *H01J 9/025* (2013.01); *H01J 19/24* (2013.01); *H01J 2201/30411* (2013.01); *H01J 2201/30449* (2013.01); *H01J 2201/30492* (2013.01); *H01J 2209/0223* (2013.01)

(58) Field of Classification Search
CPC ........................................................ H01J 1/3044
See application file for complete search history.

(56) References Cited

U.S. PATENT DOCUMENTS

| | | | |
|---|---|---|---|
| 6,387,717 B1 | 5/2002 | Blalock et al. | |
| 2006/0226753 A1 | 10/2006 | Adamec et al. | |
| 2008/0029700 A1* | 2/2008 | Fujieda | B82Y 10/00 250/310 |
| 2011/0101238 A1 | 5/2011 | Tessner, II et al. | |

(Continued)

FOREIGN PATENT DOCUMENTS

WO     2015058588 A1    4/2015

OTHER PUBLICATIONS

Lafferty, Boride Cathodes, Journal of Applied Physics, vol. 22, No. 3, pp. 299-309 Mar. 1, 1951.

(Continued)

*Primary Examiner* — Nimeshkumar Patel
*Assistant Examiner* — Jacob R Stern
(74) *Attorney, Agent, or Firm* — Hodgson Russ LLP

(57) ABSTRACT

An emitter containing a metal boride material has an at least partly rounded tip with a radius of 1 μm or less. An electric field can be applied to the emitter and an electron beam is generated from the emitter. To form the emitter, material is removed from a single crystal rod to form an emitter containing a metal boride material having a rounded tip with a radius of 1 μm or less.

20 Claims, 5 Drawing Sheets

(56) References Cited

U.S. PATENT DOCUMENTS

| | | | |
|---|---|---|---|
| 2011/0297846 A1* | 12/2011 | Wang | H01J 63/06 250/459.1 |
| 2013/0200776 A1* | 8/2013 | Hu | H01J 1/304 313/496 |
| 2015/0002009 A1 | 1/2015 | Zhang et al. | |

OTHER PUBLICATIONS

Broers, Electron Gun using Long-Life Lanthanum Hexaboride Cathode, Journal of Applied Physics, vol. 38, No. 4, pp. 1991-1992 Jan. 1, 1967.

ISA/KR, International Search Report for PCT/US2017/038315 dated Sep. 19, 2017.

* cited by examiner

HIGH BRIGHTNESS BORON-CONTAINING ELECTRON BEAM EMITTERS FOR USE IN A VACUUM ENVIRONMENT

CROSS-REFERENCE TO RELATED APPLICATIONS

This application claims priority to the provisional patent application filed Jun. 30, 2016 and assigned U.S. App. No. 62/356,738, the disclosure of which is hereby incorporated by reference.

FIELD OF THE DISCLOSURE

This disclosure relates to electron emitters fabricated from boride compounds.

BACKGROUND OF THE DISCLOSURE

Alkaline earth and rare earth boride compounds can be used for thermionic emission. These materials have physical and chemical properties that make boride compound cathodes superior to tungsten thermionic cathodes. Lanthanum hexaboride ($LaB_6$) cathodes have been used for thermionic electron emitters in scanning electron microscope (SEM) designs, transmission electron microscopes, electron beam lithography systems, and other electron optical systems. While boosting electron optical system performance, especially at low beam energy, these boride compound cathodes required complex improvements in vacuum technology to reduce oxidation-related damage.

Boride compounds, such as $LaB_6$, are very reactive to oxidants and moisture at typical cathode operating temperatures. Previous systems used cold traps, sputter ion pumps, vacuum seals, welded metal bellows, and sealing technology to maintain a vacuum environment around the boride compound cathode. Boride compound thermionic emitters also required improvements to provide emission stability. For example, independent Wehnelt bias supplies were employed to reduce the effective emitting area to only the cathode tip because dielectric films built-up over time on the cathode. For purity and cleanliness issues, specific materials are required to provide thermionic operations using a boride compound cathode.

Even with these improvements, thermionic emission electron gun assemblies for $LaB_6$ have not reached operating equilibrium, and temperature during operation was insufficient to desorb internal moisture. High partial pressure of moisture in the $LaB_6$ cathode environment caused mass loss, erosion, and damage to the cathode. Improper operating environments for the cathode can result in accelerated mass loss.

$LaB_6$ has not been used as a large emitting area thermionic emitter in a triode electron gun configuration. The source brightness is limited by space charge effects in a triode electron gun configuration. The Wehnelt potential, used to prevent undesirable "Maltese cross" shaped electron emission, can partially block the extraction potential from the anode. When used as a thermionic emitter (e.g., at approximately 1800 K), the cathode material suffers mass loss via oxidation and sublimation of the boride material or formed oxide. The sublimation process results in a change to the shape and emission characteristics of the cathode and, over time, parts of the emitting surface or bulk of the emitter material can be lost. Any sublimated or evaporated oxide can become an insulating film that contributes to the instability of the optics.

Operating a cathode at reduced temperature can reduce the mass loss rate of the boride material from the cathode. Lower temperatures reduce material deposition on the back side of the Wehnelt electrode (e.g., $LaB_6$). However, operation of metals (e.g., La, Hf) or other rare earth boride cathode emitters at reduced temperatures in high vacuum environments can cause the emitting surface to be easily poisoned by partial pressures of organic contaminants.

Therefore, what is needed is an improved metal boride electron emitter.

BRIEF SUMMARY OF THE DISCLOSURE

In a first aspect, an apparatus is provided. The apparatus comprises an emitter containing a metal boride material. The emitter has an at least partly rounded tip with a radius of 1 µm or less.

The metal boride material can include a species selected from the list consisting of an alkali metal, an alkaline earth metal, a transition metal, a lanthanide, and an actinide. The metal boride material can be a metal hexaboride material. The metal boride material can include $LaB_6$. The metal boride material can have a <100> crystal orientation.

The emitter can have an emitting area of less than 1 $mm^2$. The rounded tip can have a radius of 700 nm or less, a radius of 450 nm or less, or a radius of 100 nm or less. The emitter can have an emitting area less than 1 $µm^2$. The at least partly rounded tip can include a flat emitting facet.

In a second aspect, a method is provided. The method comprises providing an emitter containing a metal boride material; applying an electric field to the emitter; and generating an electron beam from the emitter. The emitter has an at least partly rounded tip with a radius of 1 µm or less;

The generating can occur in cryogenic field emission mode, room temperature field emission mode, warm temperature field emission mode, thermal field mode, and/or photocathode mode. The warm temperature field emission mode operates at a temperature greater than ambient and below 1000 K.

The generating can occur at an operating pressure of $10^{-9}$ Torr or less or at an operating pressure of $10^{-11}$ Torr or less.

In a third aspect, a method is provided. The method comprises removing material from a single crystal rod to form an emitter containing a metal boride material. The emitter has an at least partly rounded tip with a radius of 1 µm or less.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

The embodiments disclosed herein provide an emitter with high brightness, good stability, and long lifetime. As disclosed herein, the emitting area of the emitter is reduced from conventional boride cathodes to improve brightness. Boride emitting areas are typically in the tens to hundreds of µm². Brightness of thermionic emitting surfaces is, in part, dictated by the size of the emitting area. For example, typical emitters can be 20 µm diameter or larger. An emitter as disclosed herein can instead have an emitting area less than 1 µm². Reduction of the size of the emitting area can increase brightness by several orders of magnitude. The embodiments disclosed herein can be retrofitted into existing systems, which reduces redesign costs.

Figure 1:
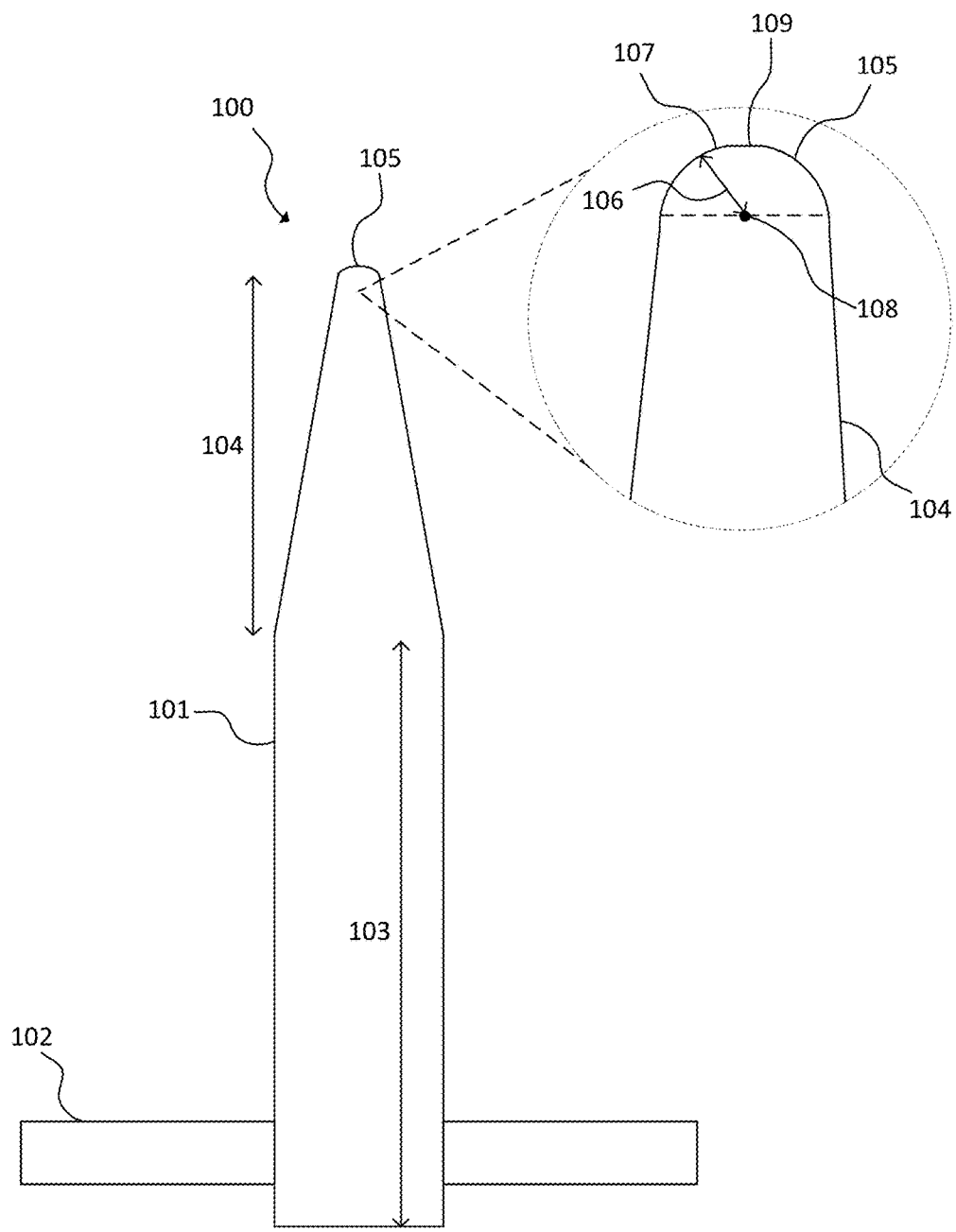
FIG. 1 is a front view of an embodiment of an electron emittance system in accordance with the present disclosure.

FIG. 1 is a front view of an electron emittance system 100, which includes an emitter 101 and emitter mounting mechanism 102. The electron emittance system 100 is configured to emit electrons into the environment or space around the electron emittance system 100. The emitter 101 has a first section 103, a second section 104, and a rounded tip 105. The first section 103 can be cylindrical. Without the rounded tip 105, the second section 104 can be generally frustoconical. The second section 104 can be disposed on a distal end of a first section 103. The second section 104 can have a tapering width or diameter between the first section 103 and the rounded tip 105. While the first section 104 and second section 105 can be generally round, both the first section 104 and second section 105 may be faceted due to the crystal structure. The rounded tip 105, which is disposed on a distal end of the second section 104, may generally be a truncated sphere. The rounded tip 105 can be at least partly or fully rounded. Other shapes than those described herein are possible.

The first section 103 or the first section 103 and second section 104 can be described as the "shaft" of the emitter 101. The shaft of the emitter 101 is held by the emitter mounting mechanism 102.

The dimensions of the emitter 101, first section 103, second section 104, or rounded tip 105 can vary. The shaft of the emitter 101 or the emitter 101 itself can be on the nanometer scale or micron scale with respect to both length and diameter.

The configuration of the emitter mounting mechanism 102 can vary from that illustrated in FIG. 1. In an example, an emitter mounting mechanism 102 supports the emitter tip using a tungsten hairpin seated on a ceramic insulator with electrodes for the hairpin legs. The hairpin can be heated to either provide flash cleaning or to raise the emitter temperature to thermal field emission (TFE) values (e.g., approximately 1,800 K). A ground-referenced power supply can provide the bias voltage for the emitter, which may be approximately 5 KV.

An electric field is applied to or otherwise in the electron emittance system 100. The electric field can be applied using charged plates or using other techniques.

The rounded tip 105 is configured to emit free electrons into an evacuated space around the electron emittance system 100. As seen in the inset of FIG. 1, the rounded tip 105 has a radius 106. The radius 106 can be measured from a center 108 of the rounded tip 105 in a bulk of the rounded tip 105 to an outer surface 107. The rounded tip 105 can have a radius 106 less than 1 µm, including all values to the 1.0 nm and ranges therebetween. For example, the rounded tip 105 can have a radius 106 of 700 nm or less, 450 nm or less, or 100 nm or less. The radius is greater than 0 µm.

The emitter 101 can have an emitting area less than 1 µm². This emitting area may be part of the outer surface 107 of the rounded tip 105.

The rounded tip 105 may be uniformly rounded or non-uniformly rounded. The rounded tip 105 may include a flat emitting facet 109. For example, there may be a flat emitting facet 109 in the form of a small <100> orientation nano-flat. This flat emitting facet 109 can be used to generate a well-collimated electron beam. In an example, the flat emitting facet 109 can provide an emitting area less than 1 µm².

In other examples, the rounded tip 105 has a generally hemispherical or paraboloidal shape. These shapes may disperse electron emission more broadly, which can result in a smaller, brighter fraction of electrons that pass into the electron optics.

To provide the desired rounded tip 105, surface crystallinity may be controlled.

Reducing the diameter of the rounded tip 105 or otherwise changing the radius of the rounded tip 105 increases the brightness of the emitted beam. The reduced brightness $B_r$ of an emitter is defined as:

$$B_r = \frac{I}{\pi r_{vs}^2 \Omega V_{ext}} \qquad \text{Eq. 1}$$

where I is the field emission current, $r_{vs}$ is the radius of the virtual source, $\Omega$ is the solid angle of the beam, and $V_{ext}$ is the operating voltage. Two parameters in the equation for brightness change when the tip diameter is reduced. First, smaller tips have higher enhancement of the electric field at the tip, so the voltage required to emit a given current decreases and the value of $V_{ext}$ is reduced, leading to a higher value for reduced $B_r$. Second, small tip diameters have lower virtual source size $r_{vs}$, resulting in a higher value of reduced $B_r$.

Use of a rounded tip 105 having a radius less than 1 µm or in the nm scale increases brightness. Brightness typically increases as the radius decreases because electrons are emitted from a smaller surface area. A boride emitter with a radius less than 100 nm will provide higher brightness values. For example, for radii of 5 nm, 10 nm, 25 nm, 50 nm, and 100 nm, the emission surface areas of the emitters are approximately 160 nm², 630 nm², 3,930 nm², 15,710 nm², and 62,830 nm², respectively.

The emitting area of the rounded tip 105 can be less than 1 mm². The emitting area of the rounded tip 105 can correspond to the entire surface area of the rounded tip 105 or just part of the surface area of the rounded tip 105. For example, the emitting area may correspond to a flat emitting facet 109.

Figure 2:
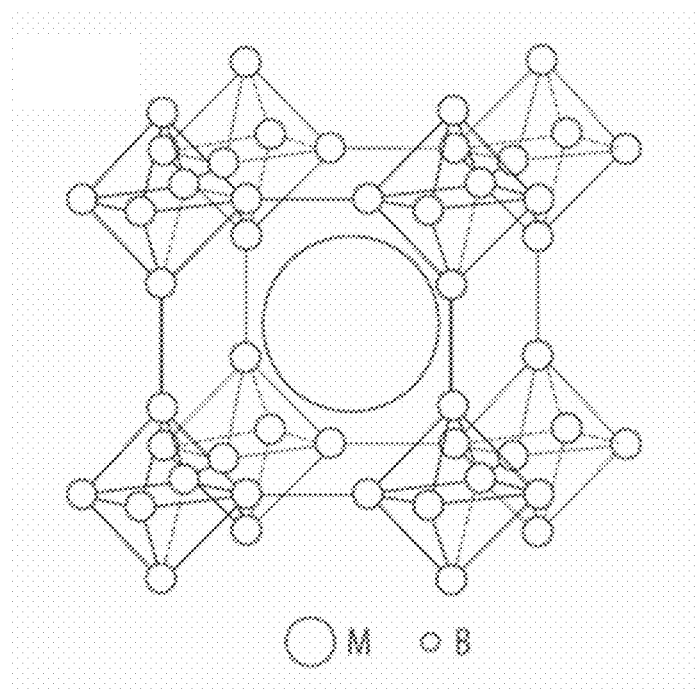
FIG. 2 is a molecular structure for a metal hexaboride.

The emitter 101 can be made of a metal boride material. For example, the metal boride material can be a metal hexaboride material, such as that in FIG. 2. In FIG. 2, the metal is represented by the large sphere M and boron is represented by the small spheres B. The metal in the metal boride material can include a species selected from the list consisting of an alkali metal, an alkaline earth metal, a transition metal, a lanthanide, and an actinide. The emitter can comprise, consist of, or consist essentially of the metal boride material as disclosed herein.

In an example, the metal boride material is or includes $LaB_6$, $CsB_6$, $CeB_6$, $CaB_6$, or other metal hexaborides. The metal boride material may include other rare-earth hexaborides of the lanthanide group. Many metal boride materials behave similarly in an emitter because their respective work functions are similar, each generally responds to surface contaminants (e.g., oxygen, water) in a similar manner, and each typically operates around the same general temperature as a thermionic emitter. However, metal borides have different volatilities. For example, $CeB_6$ is more resistant to evaporation than $LaB_6$. Operating the emitter 101 at a reduced temperature can reduce the effects of evaporation.

The metal hexaboride structure includes a caged structure of boron clusters surrounding the metal (as shown in FIG. 2), such as a transition metal or lanthanide metal, which provides low work function. Disruption of the caged structure can impair the electron density at the surface. However, other metal boride structures besides hexaborides may provide acceptable work function in an emitter.

The metal boride material also may be a superconducting $MT_4B_4$ material, wherein M is Sc, Y, Ln, Th, or U and wherein T is Ru, Os, Co, Rh, or Ir. For example, the metal boride material can be $CeCo_4B_4$.

The brightness of an emitter scales inversely with the work function of the material. The reduced brightness of an emitter material is defined in Equation 1. The field emission current I is inversely proportional to the work function of the material. Lower values of work function yield higher current and, thus, higher brightness values. The virtual source size $r_{vs}$ is inversely proportional to the work function elevated to 1/4, so virtual source size increases with lower work function, but the increase in the current dominates resulting in a net higher brightness for low work functions.

Hexaborides typically have band gap energy of approximately 2 eV. An acceptable work function for high brightness field emission typically is 5 eV or lower. Hexaboride materials such $LaB_6$ or $CeB_6$ have work functions below 3 eV. Another emitter material electrical property that is fulfilled by hexaboride materials is the dielectric permittivity. The dielectric character of semiconductors allows the electric field to penetrate the material causing Fermi pinning of the energy bands. Such Fermi pinning or degeneracy causes the conduction band to go below the Fermi level of the material, producing a emitting surface with metallic character (i.e., high electron density).

Impurities in the metal boride material can affect work function. An impurity level in the metal boride material can be selected to provide an acceptable work function in the emitter.

The metal boride chemical formula can include covalent and/or ionic bonded atoms, such as an alkali metal, alkaline earth metal, transition metal, lanthanide, or actinide atoms. In an instance, the bulk of the crystal contains covalent bonds and the surface of the crystal contains ionic bonds. Other bonding configurations in the crystal are possible.

In an instance, the metal boride material can include a combination of different metal borides.

The metal boride emitting surface at the rounded tip 105 can be made from a single crystal material for improved brightness. Amorphous or polycrystalline metal boride material also may be used. In an instance, the metal boride material is fully crystalline. In another instance, the metal boride material is partly crystalline.

The crystal orientation of the metal boride material in the emitter 101 can be <100>, as shown in FIG. 2. <100> crystal orientation has one of the lowest work function for $LaB_6$. Alternative crystallographic orientations with work functions less than approximately 3.0 eV also may be used. For example, the <310> surface is thermally stable and has the lowest work function of any single crystal plane of $LaB_6$ at 2.50 eV. Crystal orientations for $LaB_6$ in order of increasing work function are (210), (100), (110), (111), and (211). For example, $LaB_6$ crystal orientations of (100), (110), (111), and (210) produce work functions of 2.3 eV, 2.5 eV, 3.3 eV, and 2.2 eV, respectively. The orientations with increasing work function may be difficult to grow because they are thermally less stable and may reorder during growth. The non-cube faces also may be more susceptible to carbon contamination.

Figure 3:
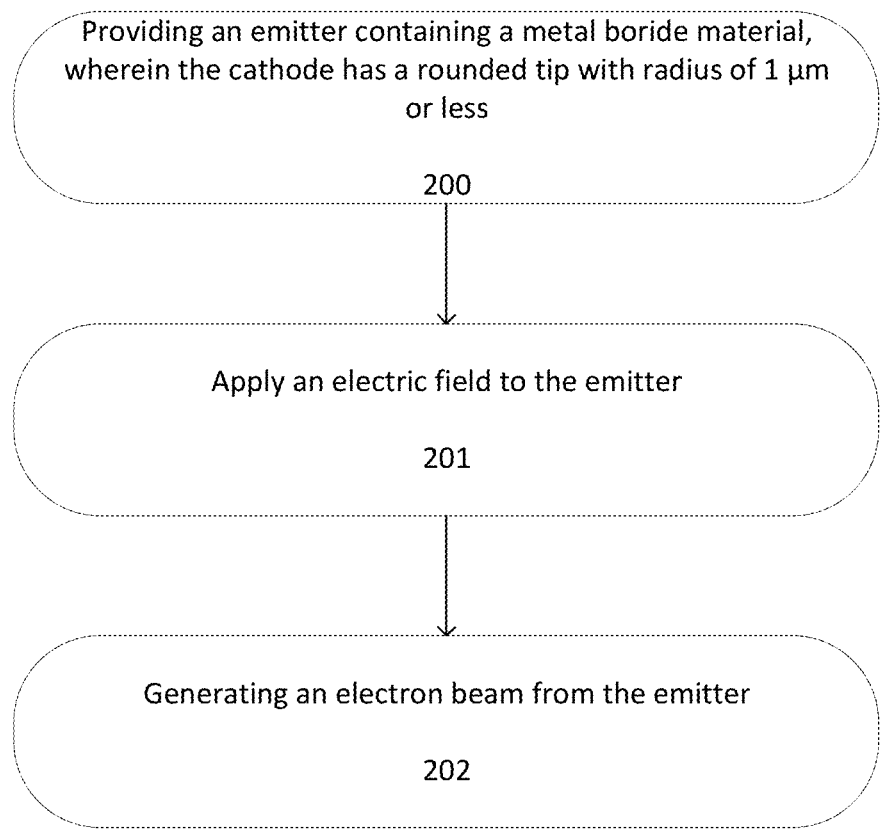
FIG. 3 is a flowchart of a method in accordance with the present disclosure.

Electrons are generated by applying an electric field to the electron emittance system 100. As seen in FIG. 3, an emitter containing a metal boride material having a rounded tip with a radius of 1 µm or less is provided at 200. An electric field is applied to the emitter at 201. An electron beam is generated from the emitter at 202.

An extraction voltage from approximately 0.5 kV to 10 kV may be used, including all ranges and values to the 0.1 kV therebetween. For example, the extraction voltage may be from approximately 1 kV to 10 kV or from approximately 1.5 kV to 10 kV.

An electric field for a metal boride material can range from approximately 1 V/nm to 4 V/nm, including all ranges and values to the 0.1 V/nm therebetween. A range of electric field from 1 V/nm to 4 V/nm may be used, in particular, with metal boride materials with work functions up to 3 eV, though other electric field values are possible.

In an example, a $LaB_6$ emitter may use extraction voltages ranging from approximately 1.5 kV to 10 kV and electric fields ranging from approximately 1 V/nm to 3 V/nm. In an instance, the electric field ranges from approximately 1.4 V/nm to 2.5 V/nm.

Figure 4:
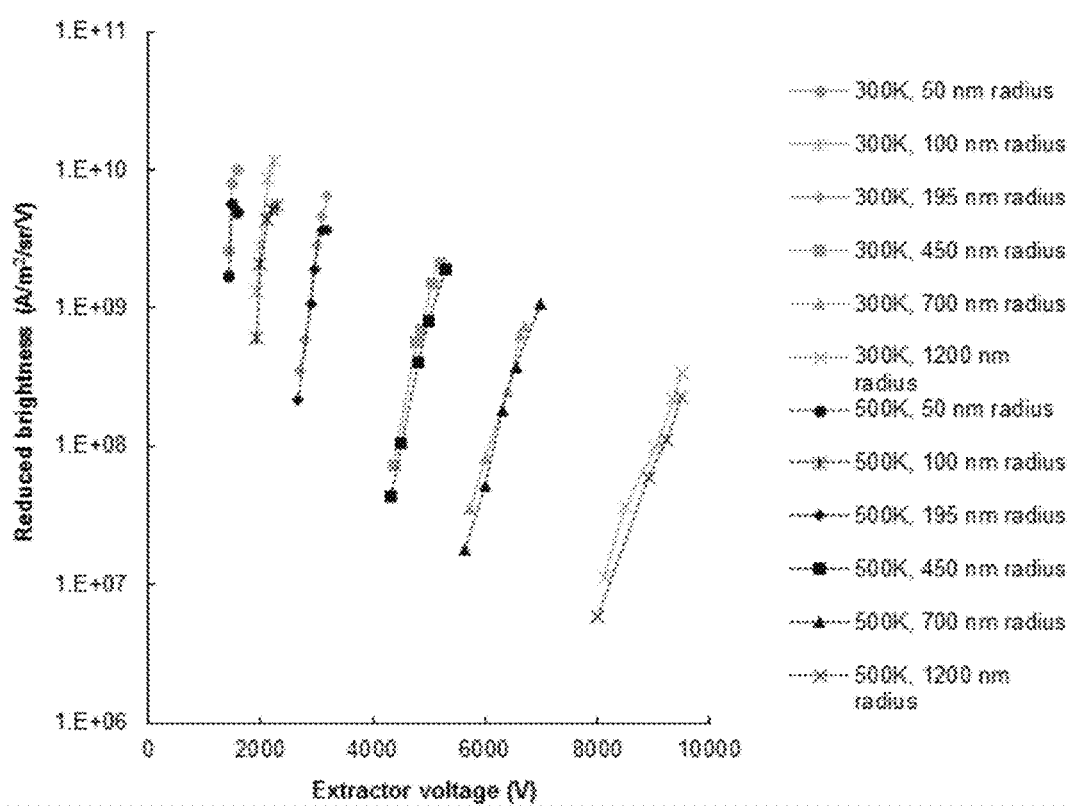
FIG. 4 is a chart comparing reduced brightness to extractor voltage for $LaB_6$.
Figure 5:
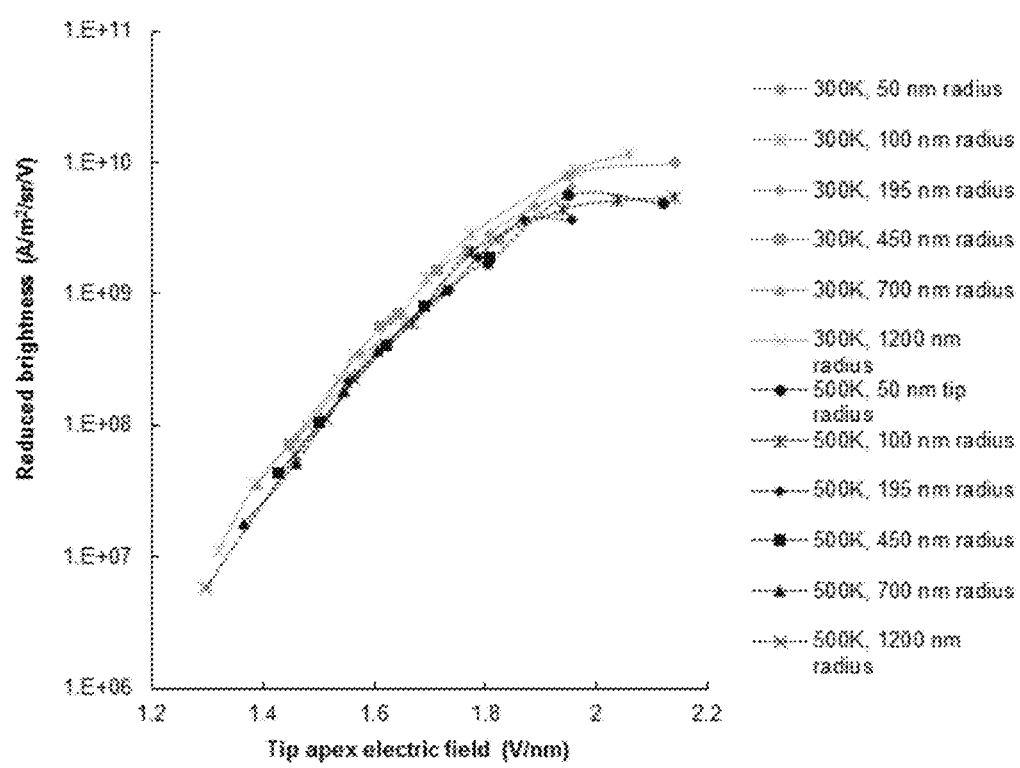
FIG. 5 is a chart comparing reduced brightness to tip apex electric field for $LaB_6$.

Stability of the emitter can be controlled. The rounded tip 105 is smaller than typical systems, but a smaller area or radius of the rounded tip 105 means that smaller particles or errors can cause instability. Thus, the electron emittance system 100 can be operated in ultra clean-high vacuum or better (e.g., an emission chamber environment with the total of partial pressures less than $E^{-9}$ Torr) to provide a combination of high brightness and long lifetime. Other vacuum parameters with higher pressure also may be used with acceptable stability, brightness, and/or lifetime. The brightness of $LaB_6$ emitters with rounded tips are plotted as a function of applied bias voltage and emitter tip apex electric field at different operating temperatures in FIGS. 4 and 5. The modeling results show that reduced brightness of $10^8$ $a/(sr \cdot m^2 \cdot v)$ can be reached with emitter tip with a radius of 1 µm and smaller.

Operation in an ultra-clean high vacuum environment provides improved results for metal boride emitters, including $LaB_6$. Most mass loss in $LaB_6$ emitters is related to high partial pressures of reactive gases in the emitter environment caused by poor vacuum. Ultra-clean high vacuum operation will reduce mass loss via evaporation or sublimation of the small diameter emitter structures, enabling more stable operation and longer emitter lifetime.

The metal boride emitters disclosed herein can be configured to operate in different modes including cryogenic field emission mode, room temperature field emission mode, warm temperature field emission mode, thermal field mode, or photocathode mode. Combinations of these modes also may be performed using the metal boride emitters disclosed herein. The metal boride emitter may be optimized for a particular mode or the parameters used in each particular mode can be tailored to the metal boride emitter. For example, the dimensions of the rounded tip may vary for each mode.

For cryogenic, cold, warm, or Schottky emission, a radius of less than 100 nm may be desired. In the case of photocathodes, the boride emitter could be a nanotip emitter or could have a flat surface with roughness in the angstrom scale. Photons that are absorbed by the emitter can match the energy band bap of the material.

In any field emission mode, an electric field is applied to or in the electron emittance system, such as using an electrode with high positive voltage. The high positive voltage attracts electrons, which causes some electrons to leave the surface of the emitter. Electrons will tunnel through the surface barrier and travel toward a biased anode when the applied electric field is high enough to reduce the potential barrier on the rounded tip-vacuum interface (i.e., quantum-mechanical tunneling).

Operating temperatures for cryogenic field emission mode may be from approximately 0 K to less than 300 K. The temperature of the system is less than or equal to the temperature of the emitter during operation. Cryogenic field emission is expected to reduce the energy distribution of the emitted electrons. Energy spread ($\Delta E$) can be decreased by narrowing Fermi-Dirac distribution at the emitter. Cryogenic field emission mode may include periodic flashing of temperature to keep emission stable.

Use of a rounded tip 105 having a radius less than 1 μm or in the nm scale with cryogenic field emission can increase brightness and provide stability at typical emitter temperatures, such as emitter temperatures from approximately 100° C. to 200° C.

A $MT_4B_4$ metal boride material may be used with cryogenic temperatures to provide superconductive properties.

Room temperature field emission generally operates at 65° F. to 100° F. (18° C. to 38° C.). The room temperature field emission operation mode may require no hardware for cooling, unlike cryogenic field emission, and, thus, can have a lower implementation cost.

The warm temperature field emission mode operates at a temperature greater than ambient and below 1000 K or at a temperature greater than ambient below the temperature at which thermionic emission is detectable in the system. The emitter temperature is between the temperature of the system and the temperature at which thermionic emission is detectable in the system. Warm temperature field emission mode can provide decreased current fluctuation due to a higher number of electrons in the conduction band, which reduces electron-hole interactions in the bulk, and/or smaller residence time of impinging molecules at the emitter tip. Warm field emission benefits from reducing the binding energy of undesired impinging molecules (e.g., $H_2O$, $H_2$, CO, $CO_2$, $O_2$, $N_2$, or hydrocarbons), thus reducing their residence time on the emitter surface.

The thermal field emission mode may use a lower extraction voltage to achieve the same brightness as, for example, room temperature field emission mode. The emitter temperature in thermal field emission mode can be approximately 1,800 K. The radius of the curved tip of the emitter may be from 0.5 μm to 1 μm for thermal field emission mode, though other radii are possible. The thermal field emission makes more energetic electrons available for emission, but at the cost of increased energy spread because of the added thermal energy spectrum. One advantage of the thermal field emission mode is that the residence time of adsorbates can be significantly reduced, and, thus, high frequency noise in the beam current is reduced. The electron optics can be configured to reduce energy spread.

In photocathode mode, light of a certain frequency falls upon the emitter. Photoelectric emission occurs to generate the stream of electrons. Thus, a photon is absorbed, an electron moves to the surface of the emitter, and the electrons escape to vacuum. This can be performed in conjunction with or separate from another field emission mode.

Some reticle and wafer inspection applications demand an electron source with the highest possible reduced brightness Br (brightness normalized with beam energy) and lowest possible energy spread ($\Delta E$) with stabilities of less than 1% during entire inspection time. High frequency current fluctuation of a field emitter can originate from the constant adsorption/desorption of the residual gas molecules in the vacuum. The root-mean-square noise is inversely proportional to a power of 1.5 of the emission surface area. As the tip radius becomes smaller, higher noise under the same vacuum conditions can occur. Lower vacuum can reduce noise. Heating the rounded tip to a temperature (e.g., from approximately 380 K to 1,000 K) during the emission to remove volatile species and prevent volatile species from remaining on the surface (reduce molecule residence time) and to maintain a clean emission surface also can provide stable emission. Heating the emitter also reduces the tunneling distance and increases electron energy, making it easier to field emit. However, heating up the emitters can cause the energy to broaden or can cause a larger energy spread.

A combined photocathode and field emission mode can enable the following process to occur. A photon is absorbed, electrons populate a conduction band, and electrons move to the surface. Heat is applied to the emitter and electrons escape to vacuum with an applied electric field. Photon energy should typically be high enough to excite electron to the conduction band but lower than ionization energy. Laser penetration depth may need to be considered when optimizing laser delivery.

For any emission mode, the evaporation rate of metal boride materials may preclude use as small tip radius field electron emitters at typical Schottky emission temperatures (e.g., operation at higher than 1500 K). For optimal lifetime and stability, a physical balance between thermodynamic processes or sharpening by the applied extracting field can be used.

The optimal total pressure for operation of boride field emitting emitters for cryogenic field emission, room temperature field emission, warm temperature field emission, or photocathode mode is $10^{-9}$ Torr or less. This operating pressure sums all of the partial pressures of vacuum relevant molecules (e.g., $H_2O$, $H_2$, CO, $CO_2$, $O_2$, $N_2$, or hydrocarbons). For $H_2$, the partial pressure limit may be $10^{-12}$ Torr, whereas for any other molecules, the partial pressure may be below $10^{-10}$ Torr.

The operating pressure may vary with operation mode. For example, operating pressure may vary with emission mechanism and surface activation energy. Thermal field emission mode may operate at $10^{-9}$ Torr or below. Cryogenic field emission mode may operate at $10^{-10}$ Torr or less. Cryogenic field emission mode also may operate at $10^{-11}$ Torr or less.

In thermal field emission, the added thermal energy can desorb contamination more easily, so there may be a decreased sensitivity to pressure. If the binding energy for adsorbates is high, then a low pressure is used to reduce the impingement rate of adsorbates.

In photocathodes, the added energy from the illumination source may provide the ability to desorb any surface contaminants, but this can depends on the surface activation energies of the materials used.

The operating pressure or other vacuum parameters affect contamination or erosion of the emitter. High particle count for the environments around the emitter, such as those caused by moisture or other particles, can result in accelerated mass loss. Work-function emitting areas can disappear and emission can fall off to near zero because only high work function surfaces are exposed to the extracting field. Any pitting of the emitting material can be crystallographically-disrupted, which affects work function.

For example, carbon contamination of emitting surfaces, especially at lower operating temperatures, can occur when a thin layer of carbon forms on the electron stream emitting surface. Carbon contaminants can be caused by volatile vacuum system related organics (e.g., oils or lubricants), residue from polishes or cleaners, residual fibers from cotton swabs or cleaning cloths, or other sources. The carbon film poisons the emitting surface with a high work function layer, which results in reduced emitted current.

In another example, oxidation, sublimation, or evaporation of material from the emitter can occur due to moisture. Consequently, refractory or dielectric material can form on other surfaces, including internal surfaces, apertures, and anode surfaces.

In yet another example, oxidation of the boride material can poison the boride material. Formation of borates can occur on or in the emitter.

To avoid carbon contamination, moisture damage, or oxidation, the vacuum environment around the electron emittance system is controlled. The operating pressure of the environment can depend on the operating mode.

Before use, the boride emitter can be conditioned by heating in the ultra-clean ultra-high vacuum environment to 1600 K for approximately 30 minutes in order to remove any oxide layer from the surface of the emitter.

Floating zone techniques may be used to prepare the metal boride material. The metal boride material may be shaped or have its size reduced. The metal boride emitters can be fabricated using various methods. The metal boride emitter can be fabricated by grinding or polishing a single crystal rod to form a sharpened tip. The metal boride emitter can be fabricated by electrochemical etching of a single crystal rod to form a sharpened tip. The metal boride emitter can be fabricated by exposure of a single crystal rod to a reactive environment to selectively remove material to form a sharpened tip. The metal boride emitter can be fabricated by exposure of a single crystal rod to a reactive environment to selectively remove material using patterned sidewall coatings on the rod to promote formation of a sharpened tip. The metal boride emitter can be fabricated by growth of single crystal nanoparticles or nanowires for use as electron emitters. The metal boride emitter can be fabricated by attachment of single crystal nanoparticles or nanowires to a mounting structure for use as electron emitters. The metal boride emitter can be fabricated by electron beam induced deposition of the boride material to form a small needle. The metal boride emitter can be fabricated by thermal-assisted sublimation in high pressure of oxygen. The metal boride emitter can be fabricated by ion bombardment. Combinations of these various fabrication techniques also can be performed.

In an instance, deposition is used to fabricate the metal boride emitter. Metal borides, such as $LaB_6$, can form slender, long aspect ratio needles under certain conditions.

In an example, a small amount of contaminant material, such as a transition metal, is deposited onto a larger seed crystal surface. Heating the seed crystal and metal contaminant causes material surface migration. The metal contaminant catalyzes boride material growth into an oriented single crystal affixed to the large seed crystal. The seed crystal can serve as a holder.

In another example, generation of small needles from a gaseous environment may be performed. Support structures may be carbon nanotubes which have transition metal inclusions. These structures may be generated using metal-organic chemical vapor deposition (MOCVD) or other processes.

Embodiments of this disclosure can be used in reticle and wafer inspection and metrology systems. The systems can be configured to provide the desired vacuum environment specifications. Examples of these systems include electron beam wafer or reticle inspection systems using single or multiple electron sources; electron beam wafer or reticle review systems using single or multiple electron sources; electron beam wafer or reticle metrology systems using single or multiple electron sources; or systems which require at least one electron source for generation of x-rays using single or multiple electron beams for use in wafer or reticle metrology, review, or inspection. The electron stream from the emitter can be directed toward a sample, such as a semiconductor wafer or other workpiece. The electron stream may travel through extraction and focusing electrodes to form an electron beam with a desired beam energy and beam current. One or more lenses can be used to create a small electron beam spot on the sample. Deflectors can be used to scan the electron beam. The sample can be placed on a stage, which may be capable of scanning relative to the electron beam. Secondary electrons and back-scattered electrons can be emitted from the sample when the electron beam hits the sample, which can be collected and accelerated toward a detector.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. An apparatus comprising:
an emitter containing a metal boride material, wherein the emitter includes a frustoconical section with an at least partly rounded tip that is in the shape of a truncated sphere, and wherein the at least partly rounded tip has a radius to a curved outer surface of 1 µm or less.

2. The apparatus of claim 1, wherein the metal boride material includes a species selected from the list consisting of an alkali metal, an alkaline earth metal, a transition metal, a lanthanide, and an actinide.

3. The apparatus of claim 1, wherein the metal boride material is a metal hexaboride material.

4. The apparatus of claim 1, wherein the metal boride material includes $LaB_6$.

5. The apparatus of claim 1, wherein the emitter has an emitting area of less than 1 $mm^2$.

6. The apparatus of claim 1, wherein the metal boride material has a <100> crystal orientation.

7. The apparatus of claim 1, wherein the radius is 700 nm or less.

8. The apparatus of claim 1, wherein the radius is 450 nm or less.

9. The apparatus of claim 1, wherein the radius is 100 nm or less.

10. The apparatus of claim 1, wherein the at least partly rounded tip includes a flat emitting facet.

11. The apparatus of claim 1, wherein the emitter has an emitting area less than 1 μm$^2$.

12. A method comprising:
provoding an emitter containing a metal boride material, wherein the emitter includes a frustoconical section with an at least partly rounded tip that is in the shape of a truncated sphere, and wherein the at least partly rounded tip has a radius to a curved outer surface of 1 μm or less;
applying an electric field to the emitter; and
generating an electron beam from the emitter.

13. The method of claim 12, wherein the generating occurs in cryogenic field emission mode.

14. The method of claim 12, wherein the generating occurs in room temperature field emission mode.

15. The method of claim 12, wherein the generating occurs in warm temperature field emission mode, wherein the warm temperature field emission mode operates at a temperature greater than ambient and below 1000 K.

16. The method of claim 12, wherein the generating occurs in thermal field mode.

17. The method of claim 12, wherein the generating occurs in photocathode mode.

18. The method of claim 12, wherein the generating occurs at an operating pressure of $10^{-9}$ Torr or less.

19. The method of claim 12, wherein the generating occurs at an operating pressure of $10^{-11}$ Torr or less.

20. A method comprising:
removing material from a single crystal rod to form an emitter containing a metal boride material, wherein the emitter includes a frustoconical section with an at least partly rounded tip that is in the shape of a truncated sphere, and wherein the at least partly rounded tip has a radius to a curved outer surface of 1 μm or less.

\* \* \* \* \*